(12) United States Patent
Fontius et al.

(10) Patent No.: US 7,719,281 B2
(45) Date of Patent: May 18, 2010

(54) METHOD TO CONTROL A MAGNETIC RESONANCE SYSTEM WITH INDIVIDUALLY CONTROLLABLE RF TRANSMISSION CHANNELS

(75) Inventors: Joerg Ulrich Fontius, Neunkirchen A. Brand (DE); Marian Lattka, Erlangen (DE); Juergen Nistler, Erlangen (DE); Franz Schmitt, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 49 days.

(21) Appl. No.: 12/051,923

(22) Filed: Mar. 20, 2008

(65) Prior Publication Data

US 2008/0231274 A1    Sep. 25, 2008

(30) Foreign Application Priority Data

Mar. 20, 2007    (DE)    ........................ 10 2007 013 422

(51) Int. Cl.
*G01V 3/00*    (2006.01)
(52) U.S. Cl. ........................ 324/322; 324/318; 324/307
(58) Field of Classification Search ......... 324/300–322, 324/200; 600/410, 422
See application file for complete search history.

(56) References Cited

U.S. PATENT DOCUMENTS

| | | | | |
|---|---|---|---|---|
| 3,430,128 | A * | 2/1969 | Lovins | 324/322 |
| 3,588,678 | A * | 6/1971 | Ernst | 324/310 |
| 4,689,563 | A * | 8/1987 | Bottomley et al. | 324/309 |
| 4,694,254 | A * | 9/1987 | Vatis et al. | 324/309 |
| 4,972,148 | A * | 11/1990 | Jensen | 324/309 |
| 5,053,709 | A | 10/1991 | Mitomi | 324/307 |
| 5,519,320 | A | 5/1996 | Kanayama et al. | 324/309 |
| 6,873,153 | B2 * | 3/2005 | Frydman | 324/307 |
| 6,900,636 | B2 | 5/2005 | Leussler | 324/318 |
| 7,042,214 | B2 * | 5/2006 | Cunningham et al. | 324/307 |
| 7,271,588 | B2 * | 9/2007 | Frydman | 324/318 |
| 7,375,523 | B1 * | 5/2008 | Hancu | 324/307 |

(Continued)

OTHER PUBLICATIONS

"Parallel RF Transmission With Eight Channels at 3 Tesla," Setsompop et al, Magnetic Resonance In Medicine, vol. 56 (2006) pp. 1163-1171.

*Primary Examiner*—Brij B. Shrivastav
*Assistant Examiner*—Tiffany A Fetzner
(74) *Attorney, Agent, or Firm*—Schiff Hardin LLP

(57) ABSTRACT

In a method for controlling a magnetic resonance system having a radio-frequency antenna structure and a number of individually controllable transmission channels, respective parallel radio-frequency signals are emitted via the transmission channels for generation of a desired radio-frequency field distribution in at least one specific volume region within an examination volume of the magnetic resonance system. A digital signal is generated for each of the transmission channels and is modulated on a carrier frequency. The radio-frequency signal so generated is transmitted via a radio-frequency signal path to the radio-frequency antenna structure and is amplified therein in a radio-frequency power amplifier. The digital signal is manipulated in a characteristic curve correction device on the basis of a correction characteristic curve predetermined for the respective radio-frequency signal path such that a distortion of the radio-frequency signal caused in the appertaining radio-frequency signal path is at least partially compensated. Respective individual correction characteristic curves for a specific measurement are predetermined for the various transmission channels dependent on a field distribution parameter that defines the desired radio-frequency field distribution. A magnetic resonance system implements such a method.

12 Claims, 4 Drawing Sheets

U.S. PATENT DOCUMENTS

| | | | |
|---|---|---|---|
| 7,466,131 B1 * | 12/2008 | Xu et al. | 324/318 |
| 7,525,313 B2 * | 4/2009 | Boskamp et al. | 324/318 |
| 7,595,641 B1 * | 9/2009 | Mehr et al. | 324/322 |
| 2005/0007111 A1 * | 1/2005 | Frydman | 324/307 |
| 2005/0134275 A1 * | 6/2005 | Frydman | 324/321 |
| 2005/0225323 A1 * | 10/2005 | Cunningham et al. | 324/307 |
| 2007/0110290 A1 * | 5/2007 | Chang et al. | 382/128 |
| 2007/0279061 A1 * | 12/2007 | Erickson et al. | 324/322 |
| 2007/0282194 A1 * | 12/2007 | Wiggins et al. | 600/422 |
| 2008/0007250 A1 * | 1/2008 | Wiggins | 324/200 |
| 2008/0100292 A1 * | 5/2008 | Hancu | 324/307 |
| 2008/0103383 A1 * | 5/2008 | van der Kouwe et al. | 600/410 |
| 2008/0129298 A1 * | 6/2008 | Vaughan et al. | 324/322 |
| 2008/0211501 A1 * | 9/2008 | Graesslin et al. | 324/318 |
| 2008/0231274 A1 * | 9/2008 | Fontius et al. | 324/309 |
| 2009/0224762 A1 * | 9/2009 | Mehr et al. | 324/314 |

\* cited by examiner

METHOD TO CONTROL A MAGNETIC RESONANCE SYSTEM WITH INDIVIDUALLY CONTROLLABLE RF TRANSMISSION CHANNELS

BACKGROUND OF THE INVENTION

1. Field of the Invention

The present invention concerns a method for controlling a magnetic resonance system having a radio-frequency antenna structure and a number of individually controllable transmission channels, in which radio-frequency signals are respectively emitted in parallel via the transmission channels to generate a desired radio-frequency field distribution in at least one specific volume region within an examination volume of the magnetic resonance system. The invention also concerns a magnetic resonance system for implementation of such a method.

2. Description of the Prior Art

Magnetic resonance tomography is a wide-spread technology to acquire images of the inside of the body of a living examination subject. In order to acquire an image with this method the body or body part of the patient or test subject to be examined must initially be exposed to an optimally homogeneous, static basic magnetic field which is generated by a basic field magnet of the magnetic resonance system. Rapidly switched gradient fields that are generated by gradient coils are superimposed on this basic magnetic field for spatial coding during the acquisition of the magnetic resonance images. Moreover, radio-frequency pulses of a defined field strength (known as the "$B_1$ field") are radiated with radio-frequency antennas into the examination subject. The nuclear spins of the atoms in the examination subject are excited by these radio-frequency pulses such that they are deflected from their equilibrium state (parallel to the basic magnetic field) an amount known as an "excitation flip angle". The nuclear spins then precess around the direction of the basic magnetic field. The magnetic resonance signals thereby generated are acquired by radio-frequency acquisition antennas. The magnetic resonance images of the examination subject are generated on the basis of the acquired magnetic resonance signals.

Different images can be generated by the emission of different pulse sequences that respectively include a series of radio-frequency pulses and gradient pulses precisely correlated to one another. A method to monitor and optimize the pulse sequences is explained in U.S. Pat. No. 5,519,320.

The tomography scanner typically has an antenna structure permanently installed in the housing thereof for the emission of the required radio-frequency pulses in the patient positioning region. This radio-frequency antenna is also known as a body coil. It has (for example in the typically employed birdcage structure) a number of conductor rods arranged around the patient space and running parallel to the main field direction, which are connected with one another by ferrules (annular conductors) at the ends of the coil. As an alternative to this, however, there are also other antenna structures permanently installed in the housing such as, for example, saddle coils. Conventional magnetic resonance systems have essentially only one transmission channel for emission of the $B_1$ field, meaning that there is only one transmission line that leads from the radio-frequency antenna to the antenna structure. Insofar as the antenna (such as, for example, a birdcage antenna) is fashioned such that a circularly-polarized field can be emitted, the radio-frequency signal from the radio-frequency antenna is split via a hybrid module into two signals that are offset from one another by 90° in their phase. The two signals are then fed into the antenna structure at precisely defined connection points via two transmission lines. The distribution of the $B_1$ field is unalterably fixed by the splitting to the two signal paths with the phases of 0° and 90° and cannot be adapted to the current conditions of the present measurement. Moreover, local coils can also be used that are arranged directly on the body of the patient, but these coils are normally used only as acquisition coils.

The generation of the radio-frequency pulses or radio-frequency pulse sequences for generation of the desired $B_1$ field initially ensues via generation of a digital signal on the basis of which an RF signal is then generated. This is schematically shown in FIG. 1. The generation of the digital signal DS ensues here in a digital pulse generator 3' in a channel control unit 2'. This digital signal DS already exhibits the desired pulse shape of the radio-frequency pulse or the radio-frequency pulse sequence to be generated. The digital signal DS is mixed with the desired RF carrier frequency RFT in a modulator 7'. The carrier frequency RFT depends on the magnetic field as well as on the desired data acquisition, i.e. on which nuclear spins should be excited, such as whether $H_1$, $F_{19}$, $P_{31}$, $NA_{23}$, $C_{13}$ or other protons will be excited. Given a 3 Tesla basic magnetic field and an $H_1$ excitation (desired in most cases), the carrier frequency is, for example, 123 MHz. The radio-frequency signal RF generated in the modulator essentially exhibits all characteristics of the radio-frequency signal to be emitted, meaning that it has the exact pulse shape and the required carrier frequency. Only the power of the yet unamplified signal is relatively low. This signal RF is therefore also frequently designated as a radio-frequency small (low-level) signal.

This radio-frequency small signal RF is then sent to the radio-frequency antenna structure 10 via a signal path, wherein it is normally amplified in an RFPA (radio-frequency power amplifier) 8'. After this amplification, in order to monitor the radiated radio-frequency power in order to ensure the compliance with the SAR limit values (SAR=specific absorption rate) a signal portion is typically extracted (tapped) in a directional coupler 9R' and monitored in a radio-frequency monitoring device 9', often also designated as an RFSWD (radio frequency safety watch dog).

Imperfections in the signal path (in particular in the radio-frequency power amplifier 8' but also in the feed lines and further employed conductors in the signal path) lead to small but unavoidable phase and amplitude distortions of the radio-frequency signal RF' that is ultimately fed into the antenna structure 10. This means that the radio-frequency signal RF' actually fed into the antenna structure 10 no longer exactly exhibits the original characteristics predetermined by the digital signal DS. The alterations can be described by the characteristic curves KL (the term "curve" being used in the mathematical sense as also encompassing a linear characteristic) of the amplitude and phase response over the signal path (or the radiated, distorting portion of the signal path, the RFPA 8'). An example for a characteristic amplitude line is shown in FIG. 2A. The magnitude of the amplitude $A_{out}$ of the output signal that exits the signal path and is fed into the antenna structure 10 is plotted over the magnitude of the amplitude $A_{in}$ of the input signal arriving from the modulator 7'. An ideal characteristic curve $KA_i$ would lead to no distortions. This would be a diagonal line in the diagram. A distorted real characteristic curve $KA_r$ in practice more likely exists, as is shown in FIG. 2A as an example. This means that the output amplitude $A_{out}$ can sometimes be too high and sometimes too low, depending on the amplitude of the input amplitude $A_{in}$. The same applies for the phase response which is shown in FIG. 2B. Here the phase $\phi_{out}$ of the output signal after the signal path is plotted over the phase $\phi_{in}$ of the input signal before the signal path. Here the ideal characteristic curve $K\phi_i$ would again be a diagonal, but the real characteristic curve $K\phi_r$ actually exhibits a different curve.

In order to solve this problem, in U.S. Pat. No. 5,053,709 it is suggested to regulate the amplification factor in a control loop such that the characteristic amplification line is linear. Alternatively, what is known as a characteristic curve correction has been used. This is shown in FIG. 3. FIG. 3 shows essentially the same design as in FIG. 1. In FIG. 3, however, it is schematically shown that the characteristic curve KL is measured and the digital signal DS is pre-distorted in a characteristic curve correction unit 4' on the basis of this characteristic curve, meaning that a distorted digital signal DS' is generated therefrom. The later distortion of the radio-frequency small signal thus is compensated in the phase response, so ultimately a radio-frequency signal RF' that precisely corresponds to the requirements of the digital signal DS arrives at the antenna. For this purpose, it is sufficient for the characteristic curve to be measured once at the manufacturer upon the production of the apparatus. This is then stored in a file and can be applied by the characteristic curve correction unit in each pulse generation. Thus no change of the stored characteristic curve is therefore necessary during the lifespan of the apparatus except for the cases in which components within the signal path are exchanged.

A further problem of the signal adulteration that particularly occurs in newer magnetic resonance systems with basic magnetic field strengths greater than three Tesla is that considerable eddy currents can be induced in the patient upon radiation of the radio-frequency pulses. The actual homogeneously radiated $B_1$ field in the examination volume is more or less strongly distorted as a consequence. The influence of the patient body on the $B_1$ field is dependent on, among other things, the size of the patient and the proportions of the individual tissue types. For example, for a very corpulent patient a circularly-polarized magnetic field is strongly distorted into an elliptical field. By contrast, for thinner patients this distortion is not so strong. In individual cases this can lead to the situation that a reliable magnetic resonance data acquisition is problematic in specific body regions of the patient, and unusable results can occur.

One approach to address this problem is the use of antenna configurations known as transmission arrays (TX arrays) for adjustment of arbitrarily shaped $B_1$ fields. Signals for RF pulses are supplied in parallel (i.e. simultaneously or with slight temporal offset) to the radio-frequency antenna structure via different transmission channels. An example of this is explained in DE 101 24 465 A1, which describes an antenna with a number of separately controllable antenna elements. This means that each transmission channel has a separate antenna element. The radio-frequency pulses emitted with different amplitudes and phases, which radio-frequency pulses are sent out by the individual antenna elements, then superimpose in the examination volume and form the desired individually adjustable $B_1$ field distribution. Various feed lines connected to a common antenna structure alternatively can be supplied by individually controllable transmission channels, so the superimposition of the RF pulses already ensues within the antenna structure.

One possibility to modify the $B_1$ field in this manner is known as "static $B_1$ shimming", analogous to "static magnetic field shimming" of the basic magnetic field. Corrections are impressed on the $B_1$ field by amplitude and phase control elements that are installed in the individual radio-frequency channels of the system. These must then respectively be adjusted such that the desired B¬1 distribution is achieved. Such an approach is explained in the aforementioned DE 101 24 465 A1. The insertion of suitable high-precision phase control elements and amplitude control elements into every transmission channel, however, is expensive. A number of feed lines are additionally necessary in order to control the respective control elements. Another possibility disclosed in DE 101 24 465 A1 for adjustment of the corrections is to individually calculate every radio-frequency pulse of a sequence in advance. This means that each of the radio-frequency pulses emitted in parallel has a different appearance with regard to amplitude and phase. The sequence programmer who programs the necessary pulse sequences for the large number of measurement protocols in advance therefore must not only program a pulse sequence for the application in such systems, but also must expend significant effort for each of the individual transmission channels (for example eight, sixteen or more transmission channels) so as to generate individual radio-frequency pulses for every possible pulse sequence in order to achieve the desired result. This represents a considerable degree of complexity for the programmer. In addition, other corrections are required depending on the load of the MR apparatus, meaning that a number of different radio-frequency pulse sequences for a number of examination situations would then have to be specially provided for the respective apparatus.

SUMMARY OF THE INVENTION

An object of the present invention is to provide an improved method for controlling a magnetic resonance system and a corresponding magnetic resonance system.

According to the inventive method, individual characteristic curves are respectively predetermined for the various transmission channels for a specific data acquisition dependent on a field distribution parameter that determines the desired radio-frequency distribution. A corresponding magnetic resonance system has a correction characteristic curve determination device that individually determines the correction characteristic curves for the various transmission channels for a specific data acquisition dependent on a field distribution parameter that defines the desired radio-frequency distribution. This correction characteristic curve is then used within the typical characteristic curve correction device, instead of the conventional static predetermined correction characteristic curve, in order to adjust the digital signal not only with regard to compensation of the distortion of the radio-frequency signal caused in the appertaining radio-frequency signal path, but also with regard to the field distribution parameters.

In the inventive method and system, no additional phase control elements and amplitude control elements whatsoever must be installed in the individual transmission channels and the $B_1$ field corrections do not have to be taken into account in the programming of the various radio-frequency pulse sequences. Instead, these can be determined in another adjustment step, for example immediately before the actual measurement with the actual present load in the examination space, and then be taken into account within the characteristic curve correction without greater effort. Since corresponding characteristic curve correction units are already available for alteration of the digital signal, the invention can also be realized in principle without great additional expenditure. It is only necessary for respective matching individual characteristic curves for the individual measurements and for the individual transmission channels to be predetermined, instead of a constant that is established for the lifespan of the apparatus.

A corresponding correction characteristic curve determination device can also be realized in the form of a software module for a processor of a control device of the magnetic resonance system, such that a retrofitting of existing magnetic resonance systems is possible in a simple manner. In principle, a correction characteristic curve determination device can be employed in order to individually calculate the correction characteristic curves for all transmission channels. It is also possible to associate a separate correction characteristic curve determination device with each transmission channel, for example.

In principle, various values of the digital signals generated by the respective transmission channels can be individually adjusted by the characteristic curve correction device independently of the respective signals emitted by the other channels. The characteristic curve correction device is preferably fashioned such that the digital signals generated for the respective transmission channels based on the correction characteristic curves individually predetermined with regard to the measurement are adjusted with regard to their amplitude offset (i.e. their relative amplitudes with regard to the pulses emitted via the other transmission channels) and their phase offset (i.e. with regard to their relative phase with regard to the signals on the other transmission channels). By suitable relative adjustment of phase and amplitude, ultimately the desired $B_1$ field is achieved by a superimposition of the various radio-frequency signals that are fed into the antenna structure via the individual transmission channels.

The correction characteristic curves are preferably individually predetermined for a specific measurement such that a distortion of the radio-frequency distribution that is caused due to a present examination situation in the examination volume is already compensated at the input side by the manipulation of the digital signals in the respective characteristic curve correction device of the individual transmission channels. It is also possible not only to compensate unwanted distortions in the radio-frequency distribution by means of these correction characteristic curves, but also to intentionally predetermine entire inhomogeneous radio-frequency field distributions when this is desired for a specific measurement.

Individual field distribution parameters can be provided in order to achieve an arbitrary individual adjustment of the radio-frequency field distribution. For this purpose, the characteristic curve correction device advantageously has an interface for acceptance of field distribution parameters to be taken into account for a current magnetic resonance measurement to be implemented.

The characteristic curve correction device can include a correction characteristic curve calculation unit that determines an individual correction characteristic curve for the current magnetic resonance measurement to be implemented based on a current field distribution parameter and based on a known characteristic curve of the appertaining signal path that is stored in a memory. The correction with regard to the distortion in the signal path is implemented and the current desired field distribution is taken into account in this manner.

For example, radio-frequency correction values for a current magnetic resonance measurement to be implemented can respectively be determined beforehand in an adjustment measurement to acquire the matching field distribution parameters. The field distribution parameters are then determined on the basis of said radio-frequency correction values and the correction lines for the current magnetic resonance measurement to be implemented can then be determined on the basis of these field distribution parameters as well as on the basis of the known characteristic curves of the signal paths.

Methods for corresponding adjustment measurements are sufficiently known to the average person skilled in the art.

Magnetic resonance systems typically include corresponding control modules with suitable correction value determination units (in the form of software modules) anyway in order to implement adjustment measurements to acquire the radio-frequency field correction values.

It is only necessary for the determination of the field distribution parameter values on the basis of the radio-frequency field correction values to be provided by a suitable calculation unit, o to alter the radio-frequency field correction values by the characteristic curve correction device or possibly to provide such values unaltered as a field distribution parameter dependent on the correction characteristic curve calculation unit.

Correction characteristic curves for various measurement modes and/or examination situations can also be advantageously predefined and stored for a usage in later measurements. For this purpose, the magnetic resonance system can have a memory in which the predefined correction characteristic curves are stored for various measurement modes and/or examination situations. The characteristic curve correction device can exhibit a correction characteristic curve selection unit in order, for example, to select a correction characteristic curve for an individual transmission channel on the basis of a current field distribution parameter. The calculation effort to acquire the current required individual correction characteristic curves could be reduced with the use of this method, in particular in standard measurement situations.

The invention can also be advantageously employed when the radio-frequency signals are emitted via the individual transmission channels for implementation of a data acquisition known as a transit SENSE measurement (designated as TX-SENSE for short). This is a special application of transmission arrays that is based on a parallel transmission of the radio-frequency pulses, analogous to a parallel acquisition imaging. In the acquisition SENSE method the field profiles of the antenna elements (i.e. their sensitivity (SENSE=sensitivity encoding)) are additionally used in order to code the magnetic resonance signal. By contrast, the excitation process in TX-SENSE is accelerated by a suitable parallel transmission of the radio-frequency pulses. Such a method known is, for example, from the article "Parallel RF Transmission With Eight Channels at 3 Tesla" by K. Setsompop et al. in "Magnetic Resonance and Medicine 56: 1163 through 1171 (2006)".

DESCRIPTION OF THE PREFERRED EMBODIMENTS

Figure 1:
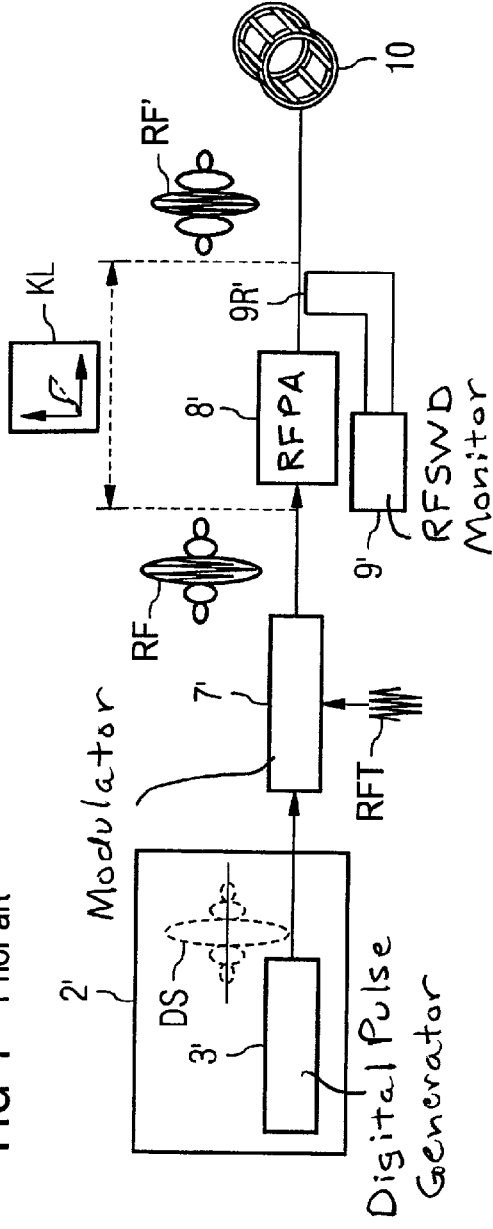
FIG. 1 is a block diagram of a radio-frequency transmission channel of a magnetic resonance system according to the prior art (without characteristic curve correction).
Figure 3:
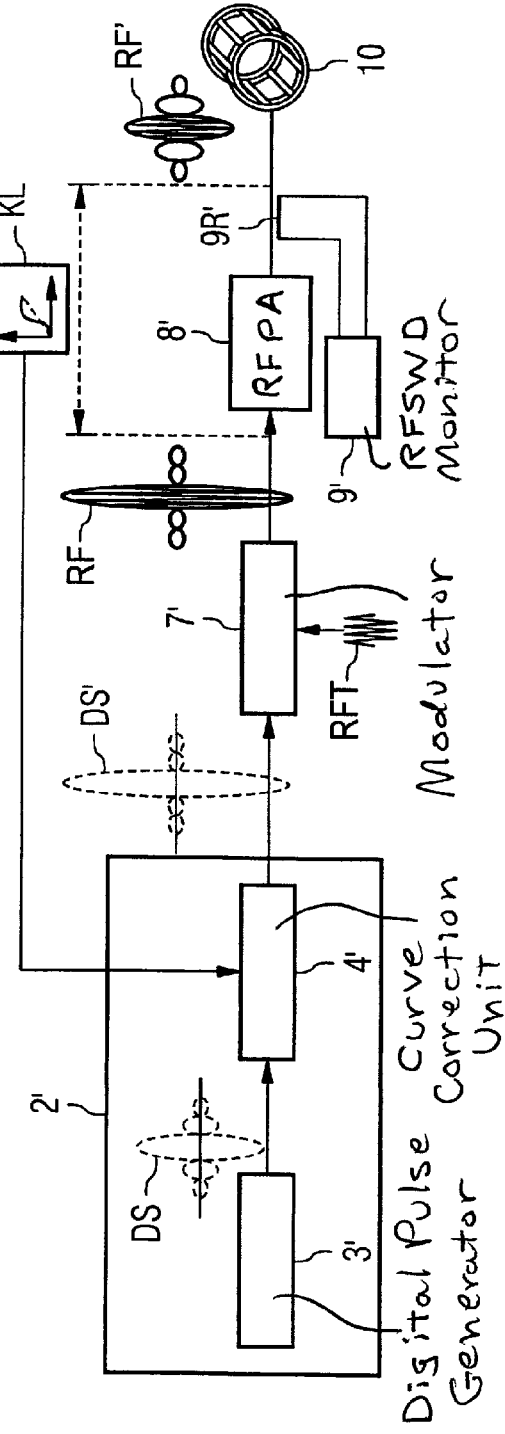
FIG. 3 is a block diagram of a radio-frequency transmission channel of a magnetic resonance system according to the prior art (with characteristic curve correction).
Figure 2A:
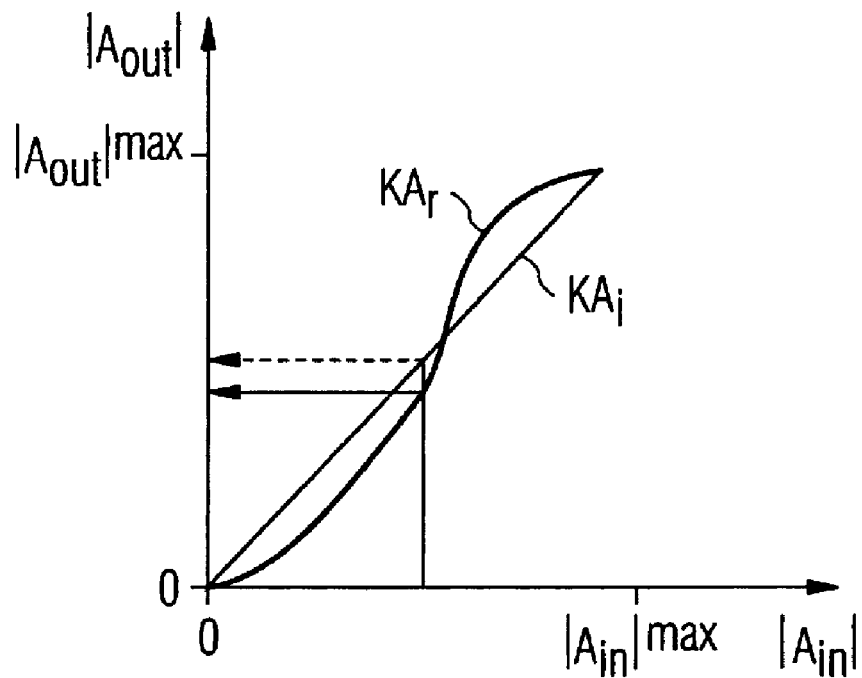
FIG. 2A is a graphical representation of an example for an amplitude response in a radio-frequency antenna.
Figure 2B:
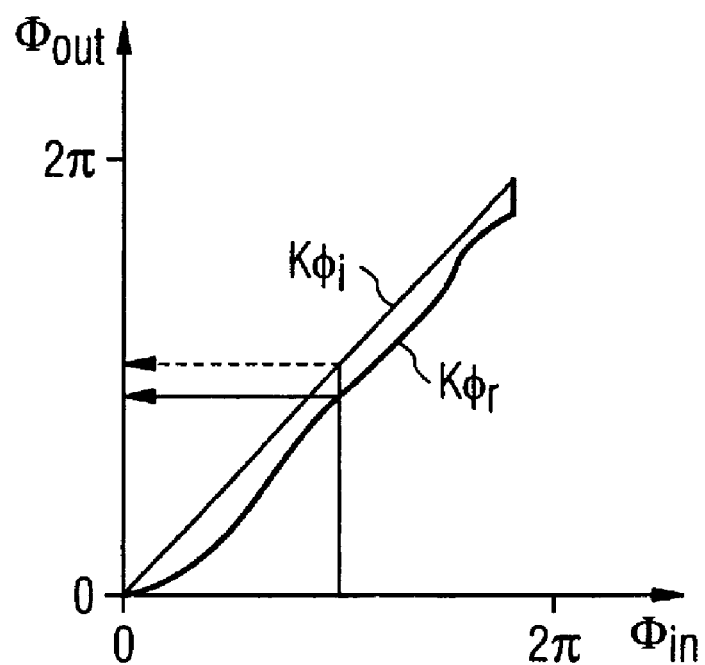
FIG. 2B is a graphical representation of an example for a phase response in a radio-frequency antenna.

FIGS. 1 through 3 were already explained in detail for clarification of the previous standard use of characteristic curve correction in conventional magnetic resonance systems. In these conventional magnetic resonance systems a characteristic curve KL of the radio-frequency transmission path or, respectively, of the RFPA 8' is measured once after manufacture of the magnetic resonance system (if necessary again after a repair of the apparatus, i.e. after exchanging specific components) and this characteristic curve KL is then statically stored within a control device 2' of the magnetic resonance system. A distortion of the digital signal DS is then provided in a characteristic curve correction unit 4' on the basis of this characteristic curve KL, such that the distortion of the finished radio-frequency signal RF' generated later by the specific characteristic curve within the transmission path is compensated again.

Figure 4:
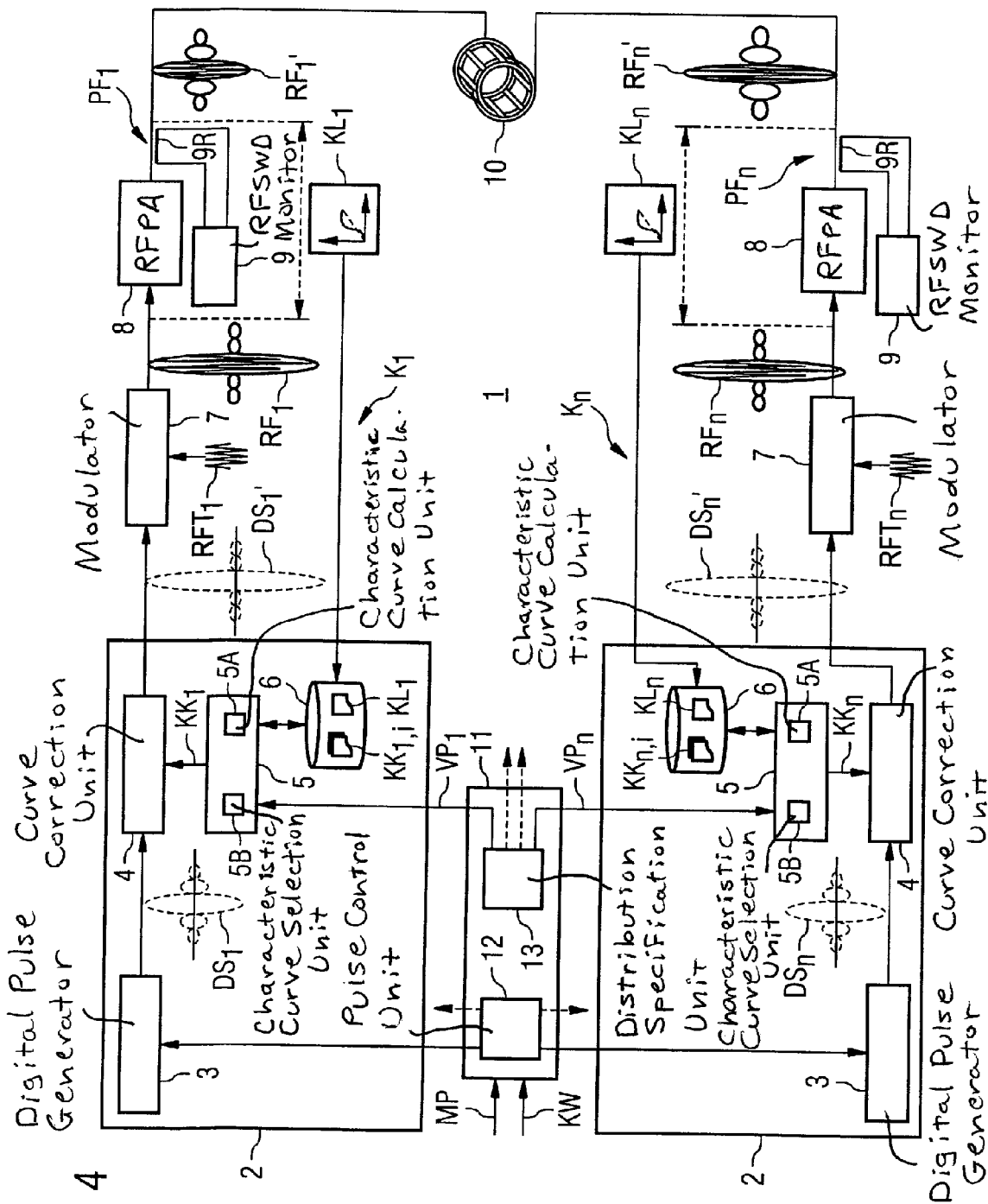
FIG. 4 is a block diagram of an exemplary embodiment of an inventive magnetic resonance system with a number of radio-frequency transmission channels.

Two transmission channels $K_1$, $K_n$ of an exemplary embodiment of an inventive magnetic resonance system 1 are schematically shown in FIG. 4. The representation of the individual transmission channels $K_1$, $K_n$ is thereby adapted to the representation of a conventional transmission channel according to FIGS. 1 and 2 in order to enable an easier comparison. It must be ensured that such an inventive transmission array magnetic resonance system 1 normally has more than two channels. In principle the system 1 can be equipped with arbitrarily many channels. Presently 8, 16 or 32 channels are typical, by only two channels $K_1$, $K_n$ are shown for better clarity.

Each of these channels $K_1$, $K_n$ has its own channel control unit 2 that include (as also in the known systems) a pulse generator 3 for generation of a digital signal $DS_1$ and a characteristic curve correction unit 4 downstream from the pulse generator 3, among other things. For example, the channel control units 2 can be what are known as PCI TX cards (PCI: peripheral component interconnect=a bus standard that is used for such transmission modules, among other things) in what is known as an AMC control computer (AMC=advanced measurement control). The digital signal $DS_1'$ emitted at the output after the characteristic curve correction unit 4 has then been modified corresponding to the predetermined correction characteristic curve $KK_1$, $KK_n$ and is provided to the input of a digital modulator 7, in which the digital signal $DS_1'$, $DS_n'$ is mixed with an RF carrier frequency $RFT_1$, $RFT_n$. In such multi-channel arrays it is thus not only possible to emit pulses with the same carrier frequency, but also in principle pulses with different carrier frequencies can be emitted in order to excite different types of atoms or metabolites in parallel, for example.

The radio-frequency small signals $RF_1$, $RF_n$ are respectively present at the output of each modulator 7. This is amplified in a subsequent radio-frequency power amplifier (RFPA) 8 and then fed into the antenna arrangement 10 via feed lines. In the shown case this is a type of birdcage antenna 10 which encompasses an examination volume U. A small portion of the radio-frequency energy is extracted in the feed lines with a directional coupler 9R after the RFPA 8 for monitoring of the compliance with the SAR limit values, and the power is monitored in a radio-frequency power monitoring unit 9 (here a RFSWD). In cases in which exceeding the allowable SAR is imminent, the emission of the radio-frequency pulses is stopped or reduced by RFSWD 9.

In the respective signal path $PF_1$, $PF_2$ (i.e. within the radio-frequency power amplifier 8 and the subsequent feed lines with the directional coupler 9R) the respective radio-frequency signals $RF_1$, $RF_n$ are not just amplified by the radio-frequency amplifier 8; but also both the amplitude and the phase are unavoidably altered slightly due to imperfections of the employed components. The characteristic curves $KL_1$, $KL_n$ of the respective signal paths $PF_1$, $PF_n$ are therefore measured within one of the signal paths $PF_1$, $PF_n$ upon startup of the apparatus or, respectively, after a repair with an exchange of essential components and said characteristic curves $KL_1$, $KL_n$ are taken into account in the characteristic curve correction 4 within the control device 2. The characteristic curves $KL_1$, $KL_n$ of the individual signal paths $PF_1$, $PF_n$ are respectively stored for this in a memory unit 6 of the control device 2 of the respective transmission channel $K_1$, $K_n$. As shown in FIG. 4, the characteristic curve $KL_1$, $KL_n$ can be measured directly from the input of the amplifier 8 up to just before the connection of the antenna arrangement 10, for example. In principle it is sufficient when the characteristic curves of the essential components (for example the characteristic curves of the radio-frequency power amplifier 8) are used for this since the further components (for example the directional couplers 9R) play only a subordinate role in the distortion of the RF signals in many cases.

In such a magnetic resonance system 1 with a transmission channel array it is required that the individual channel control units 2 operate synchronized among one another, meaning that it must be ensured that the respective desired pulse sequences are generated in sync in the pulse generators 3 and are fed into the antenna structure 10 with matching phases and amplitudes relative to one another via the signal paths $PF_1$, $PF_n$.

For this purpose, the respective pulse shapes to be generated must be provided to the pulse generators 3 of the individual transmission channels $K_1$, $K_n$ by a pulse control unit 12 or the like. Which pulses are to be emitted depends on the respective measurement which is defined by a measurement protocol MP that, for example, is predetermined by a control computer (host) or, respectively, is selected via this by an operator.

In the present case the synchronization ensues via a master control unit 11 in which, for example, the pulse control unit 12 is located as a module. In principle it is also possible (and given specific exemplary embodiments it is even preferable) that one of the channel control units 2 serves as a master (master PCI TX) and the other channel control units 2 (slave PCI TX) run in a "slave" mode and receive their synchronization commands from this "master" channel control unit 2. For the present invention, however, it is largely insignificant whether the synchronization ensues by an additional master control unit 11 or by one of the channel control units 2.

In the case shown in FIG. 4, pulses with the same pulse shape should respectively be emitted via both transmission channels $K_1$, $K_n$, wherein only one amplitude and phase shift should ensue to the effect that a specific field distribution should be achieved within the examination volume U of the antenna structure 10. For example, in the concrete case the radio-frequency signal $RF_n'$ emitted via the transmission channel $K_n$ shown below should exhibit a greater amplitude than the radio-frequency signal $RF_1'$ emitted via the transmission channel $K_1$ shown above. A phase shift is not shown in FIG. 4, however can likewise ensue. Moreover, the signals $RF_1'$ and $RF_n'$ are identical.

Which amplitude relationships and phase relationships the respective signals must exhibit in order to achieve a specific desired $B_1$ field distribution in the examination volume U can be established, for example, by adjustment measurements in which a measurement is made as to what effects a load generated by the patient in the examination volume U of the antenna has with regard to the $B_1$ field distribution, for example. In this adjustment measurement correction values KW are then determined that, for example, can be provided to the master control unit 11. This then calculates field distribution parameters $VP_1$ and $VP_n$ in a $B_1$ field distribution specification unit 13, which field distribution parameters $VP_1$ and $VP_n$ are respectively provided to the channel control units 2 and which set the requirements for the relative phases and relative amplitudes of the radio-frequency pulses $RF_1'$, $RF_n'$ to be emitted via the respective transmission channels $K_1$, $K_n$ (independent of the shape predetermined by the pulse control unit 12). The field distribution parameters $VP_1$, $VP_n$ are respectively supplied to a characteristic curve determination unit 5 within the channel control units 2. This characteristic curve determination unit 5 exhibits a characteristic curve calculation unit 5B which determines a suitable correction characteristic curve $KK_1$, $KK_n$ on the basis of the characteristic curves $KL_1$, $KL_n$ already determined for the respective signal paths $PF_1$, $PF_n$ of the appertaining transmission channel $K_1$, $K_n$ and on the basis of the field distribution parameters $VP_1$, $VP_n$, which suitable correction characteristic curve $KK_1$, $KK_n$ is then provided to the characteristic curve correction unit 4. This normally occurs before the measurement and then applies for the entire further measurement.

Alternatively, finished characteristic curves $KK_{1,i}$, $KK_{n,i}$ can be calculated beforehand for specific examination situations or for specific field distribution parameters $VP_1$, $VP_n$ which represent the examination situation in a certain manner, and said finished characteristic curves $KK_{1,i}$, $KK_{n,i}$ can have been stored in a memory 6. These individual correction characteristic curves $KK_{1,i}$, $KK_{n,i}$ respectively already include the characteristic curve $KL_1$, $KL_n$ predetermined by the signal path $PF_1$, $PF_n$ and likewise to be taken into account in the correction.

For example, the matching finished correction characteristic curve $KK_{1,i}$, $KK_{n,i}$ can simply be selected by a characteristic curve selection unit 5A of the characteristic curve determination unit 5 on the basis of the acquired field distribution parameters $VP_1$, $VP_n$ and this can be provided as a current correction line $KK_1$, $KK_n$ of the characteristic curve correction unit 4.

It should be noted that it is also sufficient to instead set up a separate characteristic curve determination unit in each transmission channel control unit 2, to provide a central characteristic curve determination unit in a master control unit or in a channel control unit serving as a master or in a host computer or the like, that calculates the characteristic curves for the various transmission channels $K_1$, $K_n$ for the individual characteristic curve correction units 4 before the measurement and then forwards these to the channel control units 2.

As mentioned, the effect of this method is shown in FIG. 4 only using the amplitudes. The digital signals $DS_1$, $DS_n$ still appear identical here after the pulse generator 3. However, since ultimately the radio-frequency signals $RF_1'$, $RF_n'$ which should be fed into the antenna structure 10 should exhibit different amplitudes, the digital signals $DS_1$, $DS_n$ are not only pre-distorted in the characteristic curve correction unit 4 for compensation of the physical characteristic curves KL1, KLn of the respective signal paths $PF_1$, $PF_n$ but also are amplified with a different amplitude so that different digital signals $DS_1'$, $DS_n'$ already exist after the characteristic curve correction. After the mixing in the modules 7 this leads to corresponding different small signals $RF_1$, $RF_n$, such that the desired radio-frequency signals $RF_1'$, $RF_n'$ with different amplitudes exist after the amplification by the radio-frequency amplifier 8.

Figure 5A:
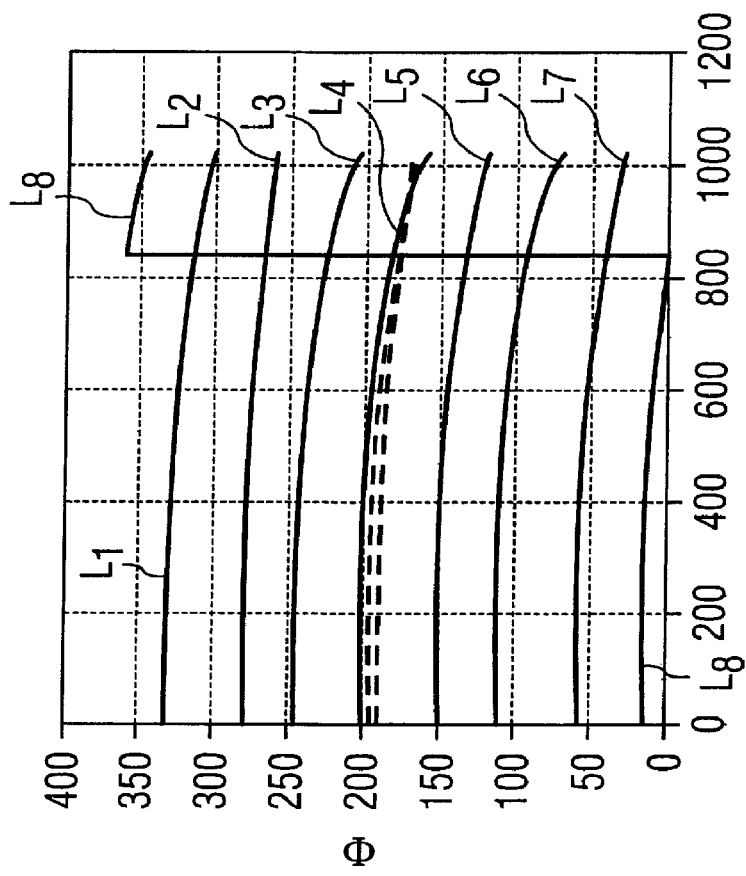
FIGS. 5A and 5B are graphical representations of an example of an adaptation of phase correction characteristic curves to achieve a specific $B_1$ field distribution in accordance with the invention.
Figure 5B:
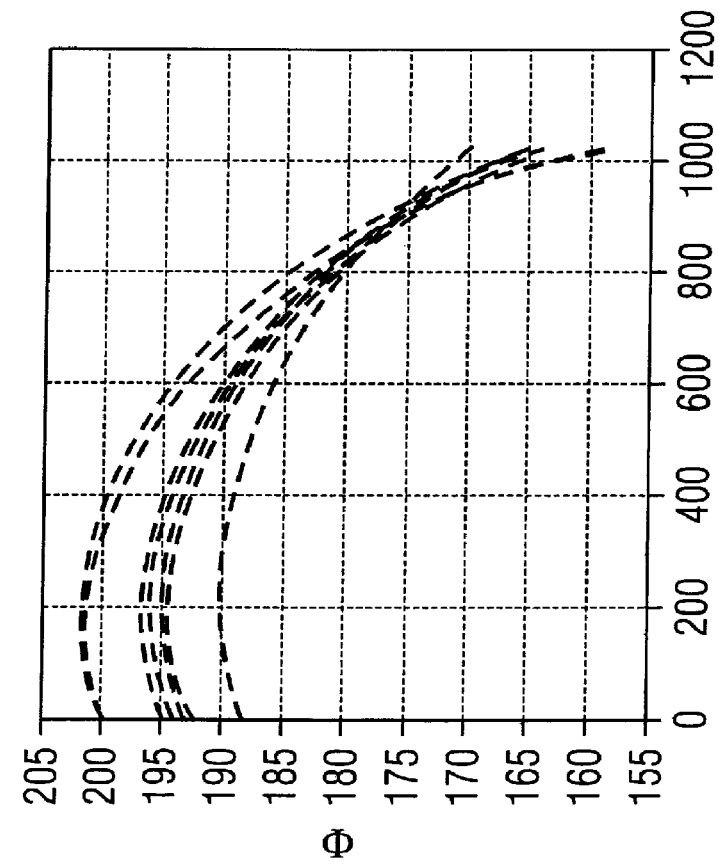

FIGS. 5a and 5b show diagrams for an example of such a characteristic curve adaptation with regard to phase. The phase $\phi$ is thereby plotted over a measured voltage (in volts). The eight original radio-frequency characteristic curves of an 8-channel transmission array (that lie relatively close to one another) are shown in FIG. 5. FIG. 5B shows the characteristic curves after a possible modification. The original characteristic curves from FIG. 5A are shown again in FIG. 5B as central dashed lines for comparison. The solid lines are respectively the phases of the eight RF characteristic curves $L_1$ through $L_8$ after the modification, wherein the modification ensues here such that a homogeneous excitation is achieved within an examination volume U of a birdcage antenna arrangement. Such a homogeneous excitation is also designated as a CP mode (circular phase). This corresponds to a phase difference of the eight channels of respectively $360°/8=45°$. Such a phase change (as shown in FIG. 5) of the signals can inventively ensue here within the characteristic curve correction unit 4. Since the control parameters of the channels can be arbitrarily adjusted in a simple manner with the aid of the characteristic curve correction unit 4 with this method, other optimized excitations are also possible.

For example, an optimized homogeneous excitation already mentioned is possible in which the typical CP excitation explained above using FIG. 5 is modified dependent on specific patient-dependent parameters in order to achieve an even better homogeneity.

A further possibility is the adjustment of a SAR-optimized mode. The parameters for the characteristic curves are thereby selected such that the power absorbed in the patient is minimized. The parameters are thereby generally dependent on the patient and the examination region and must be determined or, respectively, calculated before the actual measurement.

For example, in order to adjust what is known as a gradient mode (also called "Mode +2") it must be ensured for this that a phase difference of 90° is respectively set between the eight channels. A radio-frequency field is therewith generated that has a zero point in the center of the examination volume and increases moving outwardly.

A special adjustment to achieve a locally limited excitation is likewise conceivable. When, for example, a specific body part (for example a shoulder) should be examined, the activation of the individual transmission channels can ensue such that only the volume elements transmit in the region of the shoulder since only there is a radio-frequency signal required. This can be realized in a simple manner in that the characteristic curve correction units 4 are adjusted such that the amplitude of the digital signals $DS_1$, $DS_n$ is set to zero on the channels that should not transmit. The advantage of such a local excitation is apparent since less unnecessary power is radiated into the patient and thus the SAR can be reduced.

Lastly, it is again noted that the method as well as the magnetic resonance system described in the preceding are only exemplary embodiments which can be modified by those man skilled in the art in various ways without depending from the scope of the invention.

We claim as our invention:

1. A method for controlling a magnetic resonance system comprising a radio-frequency (RF) antenna structure and a plurality of individually controllable transmission channels, comprising the steps of:
   in parallel, supplying a plurality of RF signals respectively via the transmission channels to the antenna structure to cause the antenna structure to radiate a predetermined RF field distribution in at least one volume region within an examination volume of the magnetic resonance system;
   in each of said transmission channels, modulating a digital signal therein on a carrier frequency to produce the RF signal within that transmission channel; from each transmission channel, supplying the RF signal therein via an RF signal path therefrom to an RF power amplifier and amplifying the RF signal in said RF amplifier, said RF signal path imparting a distortion to the RF signal therein;
   prior to amplifying each RF signal in said amplifier, correcting the RF signal with a correction characteristic curve of the RF signal path in which the RF signal is conducted; and
   for each of said transmission channels, predetermining the respective correction curve of the signal path therefrom dependent on a field distribution parameter that defines said predetermined RF field distribution prior to radiation by said antenna structure.

2. A method as claimed in claim 1 comprising, with the respective correction curves, correcting the respective digital signals with regard to an amplitude offset and a phase offset caused by said distortion.

3. A method as claimed in claim 1 comprising, for a predetermined data acquisition to be executed by said magnetic resonance apparatus, identifying distortions that will occur in said RF field distribution during the data acquisition due to a current examination situation in the examination volume, and defining the respective field distribution parameter dependent on said RF field distortion to additionally compensate for said RE field distortion in the respective correction curves.

4. A method as claimed in claim 3 comprising generating the respective field distribution parameters by measuring said RE field distortion in said magnetic resonance apparatus with said examination situation prior to executing said current data acquisition, and generating respective correction curves for said current magnetic resonance data acquisition from said measurement and from respective correction curves that correct for said distortions in the respective RE signal lines.

5. A method as claimed in claim 4 comprising predetermining the respective correction characteristic curves, that correct both for the RF field distortion and the RE signal line distortion, and storing the predetermined correction characteristic curves, respectively associated with different examination situations, in a memory.

6. A method as claimed in claim 1 comprising emitting said radio-frequency signals in the respective transmission channels to implement a transmit SENSE magnetic resonance data acquisition.

7. A magnetic resonance system comprising:
   a magnetic resonance scanner comprising a radio-frequency (RF) antenna structure and a plurality of individually controllable transmission channels associated therewith;
   an RF signal source that in parallel, supplies a plurality of RF signals respectively via the transmission channels to the antenna structure to cause the antenna structure to generate a predetermined RF field distribution in at least one volume region within an examination volume of the magnetic resonance system;
   each of said transmission channels comprising a modulator that modulates a digital signal therein on a carrier frequency to produce the RF signal emitted by that transmission channel;
   a plurality of RF amplifiers respectively connected to said transmission channels, each transmission channel supplying the RF signal emitted thereby via an RF signal path to the RF power amplifier connected thereto for amplifying the RF signal in said RF amplifier, said RF signal path imparting a distortion to the RF signal therein; and
   each of said transmission channels comprising a correction unit having a predetermined correction curve therein for the RF signal path and RF amplifier associated with that transmission channel, each correction curve being dependent on a field distribution parameter that defines said predetermined RF field distribution and, prior to amplifying each RF signal in said amplifier, the correction unit in each transmission channel, and each correction unit correcting the RF signal in the that respective transmission channel with said correction characteristic curve.

8. A magnetic resonance system as claimed in claim 7 wherein the respective correction units, comprising, with the respective correction curves, correcting the respective digital signals with regard to an amplitude offset and a phase offset caused by said distortion.

9. A magnetic resonance system as claimed in claim 7 wherein the respective correction units, of a predetermined data acquisition to be executed by said magnetic resonance scanner, identify distortions that will occur in said RF field distribution during the data acquisition due to a current examination situation in the examination volume, and define the respective field distribution parameter dependent on said RF field distortion in order to additionally compensate for said RF field distortion in the respective correction curves.

10. A magnetic resonance system as claimed in claim 9 comprising a control unit that generates the respective field distribution parameters by measuring said RF field distortion in said magnetic resonance apparatus with said examination situation prior to executing said current data acquisition, and that generates respective correction curves of said current magnetic resonance data acquisition from said measurement and from said respective correction curves that correct said distortions in the respective RF signal lines.

11. A magnetic resonance system as claimed in claim 10 wherein the respective correction characteristic curves are predetermined in order to correct both the RF field distortion and the RF signal line distortion, and wherein each correction unit comprises a memory in which the predetermined correction characteristic curves, respectively associated with different examination situations are stored.

12. A magnetic resonance system as claimed in claim 7 wherein said RF signal source emits said radio-frequency signals in the respective transmission channels to implement a transmit SENSE magnetic resonance data acquisition with said scanner.

* * * * *